(12) United States Patent
Kang et al.

(10) Patent No.: US 6,285,068 B1
(45) Date of Patent: Sep. 4, 2001

(54) ANTIFUSES AND METHOD OF FABRICATING THE SAME

(75) Inventors: Dong-Man Kang; Jung-Ho Kang, both of Chungcheongbuk-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/053,627

(22) Filed: Apr. 2, 1998

(30) Foreign Application Priority Data

Sep. 12, 1997 (KR) ................................. 97/47150

(51) Int. Cl.[7] .................. H01L 29/00; H01L 29/04; H01L 36/036; H01L 21/82
(52) U.S. Cl. .................. 257/530; 257/529; 257/50; 257/52; 257/57; 438/131
(58) Field of Search ................ 257/50, 52, 57, 257/530, 209, 529, 741; 438/131, 467, 600

(56) References Cited

U.S. PATENT DOCUMENTS

| | | | |
|---|---|---|---|
| 4,751,197 | 6/1988 | Wills | 437/147 |
| 5,502,000 | * 3/1996 | Look et al. | 437/60 |
| 5,726,484 | * 3/1998 | Hart et al. | 257/530 |
| 5,917,229 | * 6/1999 | Nathan et al. | 257/529 |
| 5,962,815 | * 10/1999 | Lan et al. | 174/262 |

FOREIGN PATENT DOCUMENTS 0 149 121    7/1985   (EP) .

* cited by examiner

*Primary Examiner*—Olik Chaudhuri
*Assistant Examiner*—Shriminas H. Rao
(74) *Attorney, Agent, or Firm*—Fleshner & Kim, LLP

(57) ABSTRACT

The present invention provides antifuses that enhance the efficiency of a field programmable gate array and that decrease chip size. The antifuses comprise a plurality of first conductive layers formed on a substrate, an antifuse layer formed on a plurality of the first conductive layers, and a second conductive layer formed on the antifuse layer. A method of fabricating the antifuses comprises the steps of forming a plurality of first conductive layers on predetermined portions of a substrate, forming an insulating layer over the surface of the substrate, selectively etching the insulating layer to form a via hole that is connected with a plurality of the first conductive layers, forming an antifuse layer on a predetermined portion of the insulating layer, including the via hole, and forming a second conductive layer on a predetermined portion of the insulating layer, including the antifuse layer.

8 Claims, 11 Drawing Sheets

ANTIFUSES AND METHOD OF FABRICATING THE SAME

BACKGROUND OF THE INVENTION

1. Field of the Invention

The present invention relates to antifuses. More particularly, the present invention relates to antifuses suitable for improving the integration of a semiconductor device.

2. Background of the Related Art

Generally, an antifuse is the opposite of a fuse. The antifuse is formed in a default OFF-state, and is switched to an ON-state when a predetermined condition occurs. In its default OFF-state, the antifuse is an insulator with an electric resistance of several megaOhms (MΩ). In the ON-state, the electrical resistance of the antifuse drops to several hundred ohms.

The antifuse is switched from an OFF-state to an ON-state by applying a voltage of a predetermined level (7 to 10V) to first and second conductive layers. This causes a breakdown in the insulator interposed between the first and second conductive layers, thus switching the antifuse to an ON-state.

A field programmable gate array (FPGA) is a semi-custom logic integrated circuit (IC), which is less expensive and less time consuming to develop than standard Ics. Gates, i.e., basic logic devices, are arranged in parallel, and a logic integrated circuit (IC) is formed nonlinearly, thus making a user-desired circuit.

An antifuse for the FPGA is formed of amorphous silicon interposed between two conductors that are electrically separated from each other. Since the amorphous silicon has a high resistance value, it is an insulator. When an electric field is selectively created in one of the two conductors, as needed, the amorphous silicon is melted to connect the two conductors to each other, thus forming a gate array.

As shown in FIG. 1, the antifuse includes a first conductive layer 11 formed on a predetermined portion of a semiconductor substrate (not shown), an inter metal dielectric (IMD) layer 12 formed over the entire first conductive layer 11 and having a via hole whose upper portion is rounded, an amorphous silicon film 14 formed on an exposed portion of the first conductive layer 11 and a predetermined portion of the IMD layer 12, and a second conductive layer 16 formed on a predetermined portion of the amorphous silicon film 14.

FIGS. 2A–2C show a related art method of fabricating the antifuse shown in FIG. 1. The first conductive layer 11 is formed on a predetermined portion of the semiconductor substrate (not shown), and the IMD layer 12 is formed over the entire first conductive layer 11. A first photosensitive layer 13 is then applied to the IMD layer 12. The first photosensitive layer 13 is selectively exposed to light and developed so that it is removed over a region where the via hole will be formed. The IMD layer 12 is then selectively etched to form the via hole, using the first photosensitive layer 13 as a mask.

As shown in FIG. 2B, the first photosensitive layer 13 is removed, and the edges of the selectively etched IMD layer 12 are etched by an Ar sputtering technique so that the upper portion of the via hole is rounded. The amorphous silicon film 14 and the second photosensitive layer 15 are formed on the IMD layer 12, including the via hole. The second photosensitive layer 15 is then selectively exposed to light and developed so that it remains on a predetermined portion of the IMD layer 12 around the via hole. The amorphous silicon film 14 is then selectively etched, using the second photosensitive layer 15 as a mask.

Referring to FIG. 2C, after the second photosensitive layer 15 is removed, a second metal layer and a fourth photosensitive layer are formed on the IMD layer 12, including the selectively etched amorphous silicon film 14. After that, the fourth photosensitive layer is selectively exposed to light and developed so that it remains on a predetermined portion of the amorphous silicon film 14 around the via hole. The second metal layer is then selectively etched, using the fourth photosensitive layer, which was selectively exposed to light and developed, as a mask. This forms the second conductive layer 16. The third photosensitive layer is then removed. In this way, a single antifuse is made in the via hole.

The related art antifuse and the method of forming the same have the following problems.

First, there is a limit as to the number of antifuses that can be obtained per unit area to increase the chip size.

Second, once the antifuse in the via hole is used, it cannot serve as an antifuse again, thus deteriorating the efficiency of the FPGA.

The above references are incorporated by reference herein where appropriate for appropriate teachings of additional or alternative details, features and/or technical background.

SUMMARY OF THE INVENTION

Accordingly, the present invention is directed to antifuses and a method of fabricating the same that substantially obviates one or more of the problems, limitations and disadvantages of the related art.

It is an object of the present invention to provide antifuses and a method of fabricating the same, which can enhance the efficiency of a field programmable gate array (FPGA) and decrease the chip size.

To achieve these and other advantages, and in accordance with the purpose of the present invention as embodied and broadly described, the present invention provides antifuses including a plurality of first conductive layers; a second conductive layer; and an insulating layer formed between the plurality of first conductive layers and the second conductive layer, wherein the insulating layer is adapted to breakdown electrically when a predetermined voltage is applied across the first and second conductive layers.

The present invention also provides a method of fabricating antifuses, which includes the steps of forming a plurality of first conductive layers on predetermined portions of a substrate; forming an antifuse layer on a plurality of the first conductive layers; and forming a second conductive layer on the antifuse layer, wherein the antifuse layer is adapted to breakdown electrically when a predetermined voltage is applied across the first and second conductive layers.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Reference will now be made in detail to the preferred embodiments of the present invention, examples of which are illustrated in the accompanying drawings.

Figure 1:
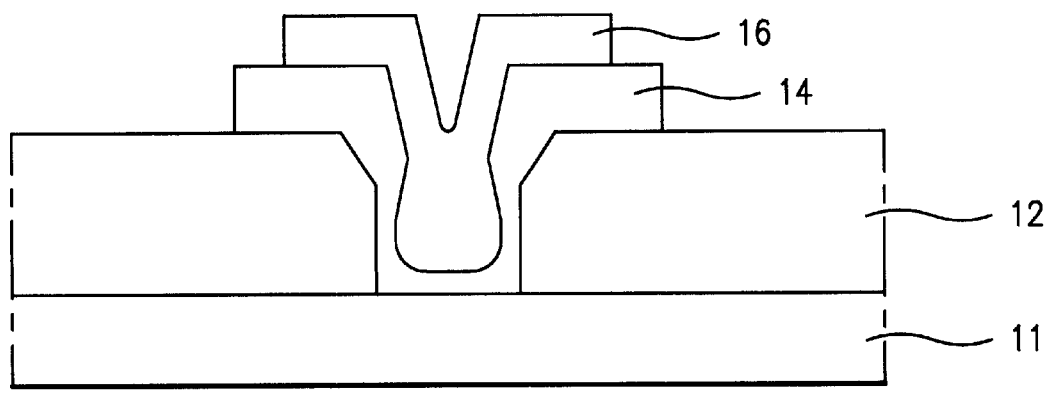
FIG. 1 is a sectional view of a related art antifuse.
Figure 2A:
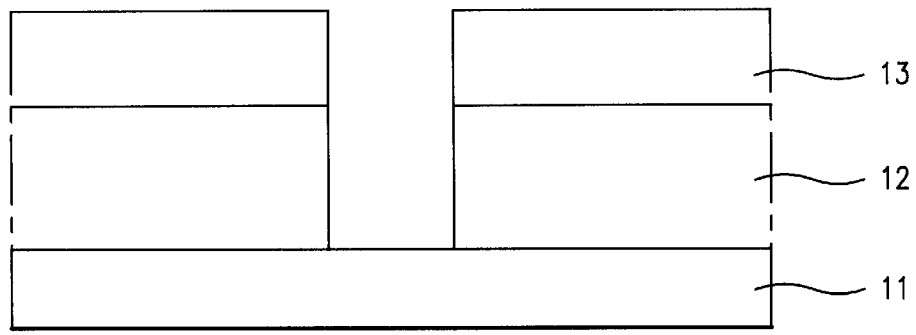
FIGS. 2A–2C are sectional views showing steps for manufacturing the related art antifuse of FIG. 1.
Figure 2B:
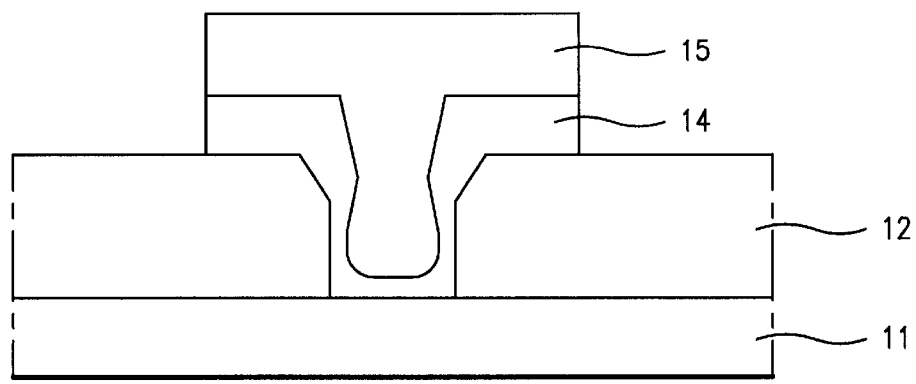
Figure 2C:
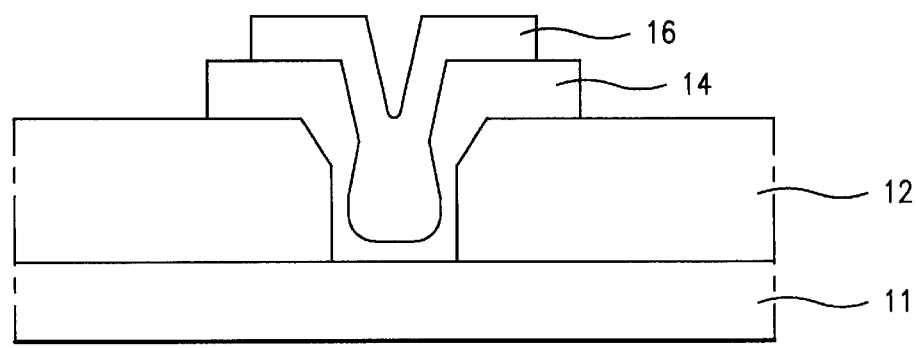
Figure 3A:
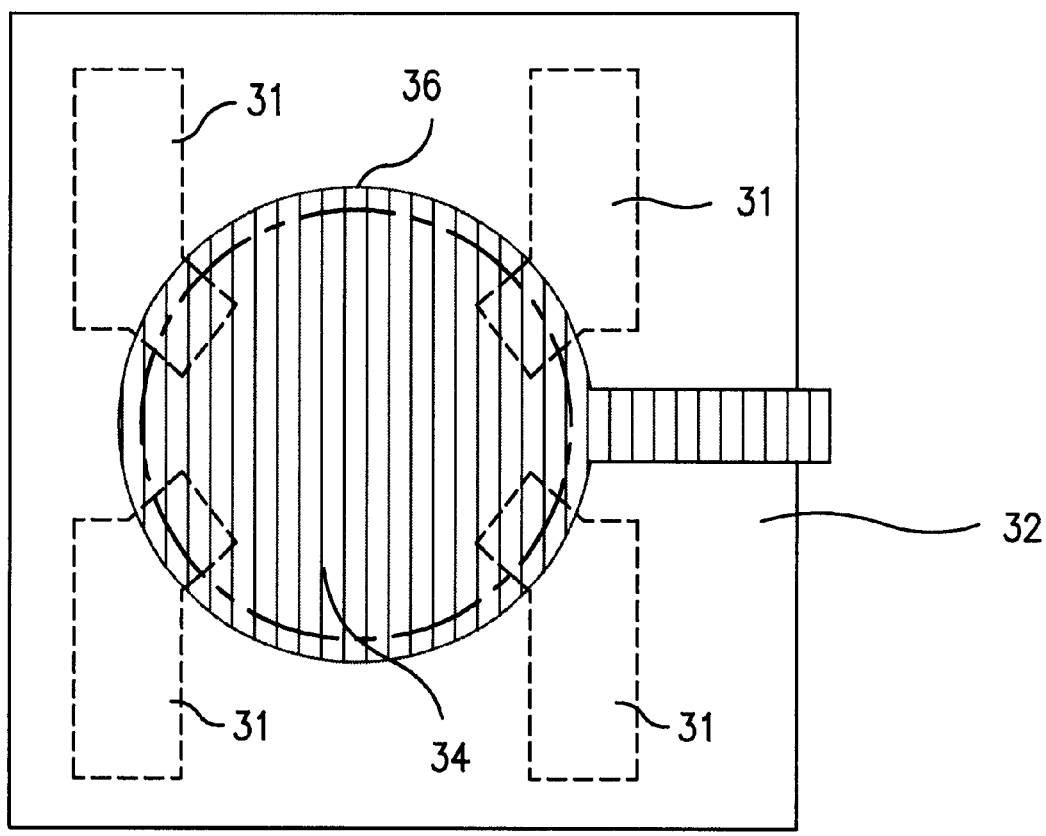
FIG. 3A is a plan view showing antifuses in accordance with a first preferred embodiment of the present invention.

FIG. 3A is a plan view of antifuses in accordance with a first preferred embodiment of the present invention, and FIGS. 4A to 4D are plan views showing preferred steps for manufacturing the antifuses shown in FIG. 3A.

In accordance with the first preferred embodiment of the present invention, antifuses include four first conductive layers 31 each formed on a predetermined portion of a semiconductor substrate (not shown), an inter metal dielectric (IMD) layer 32 connected to each of the four first conductive layers 31 at a single region, and having a via hole with a rounded upper portion, an amorphous silicon film 34 formed on a predetermined portion of the IMD layer 32, including the exposed region of each of the first conductive layers 31, and a second conductive layer 36 formed on a predetermined portion of the IMD layer 32, including the amorphous silicon film 34.

Figure 3B:
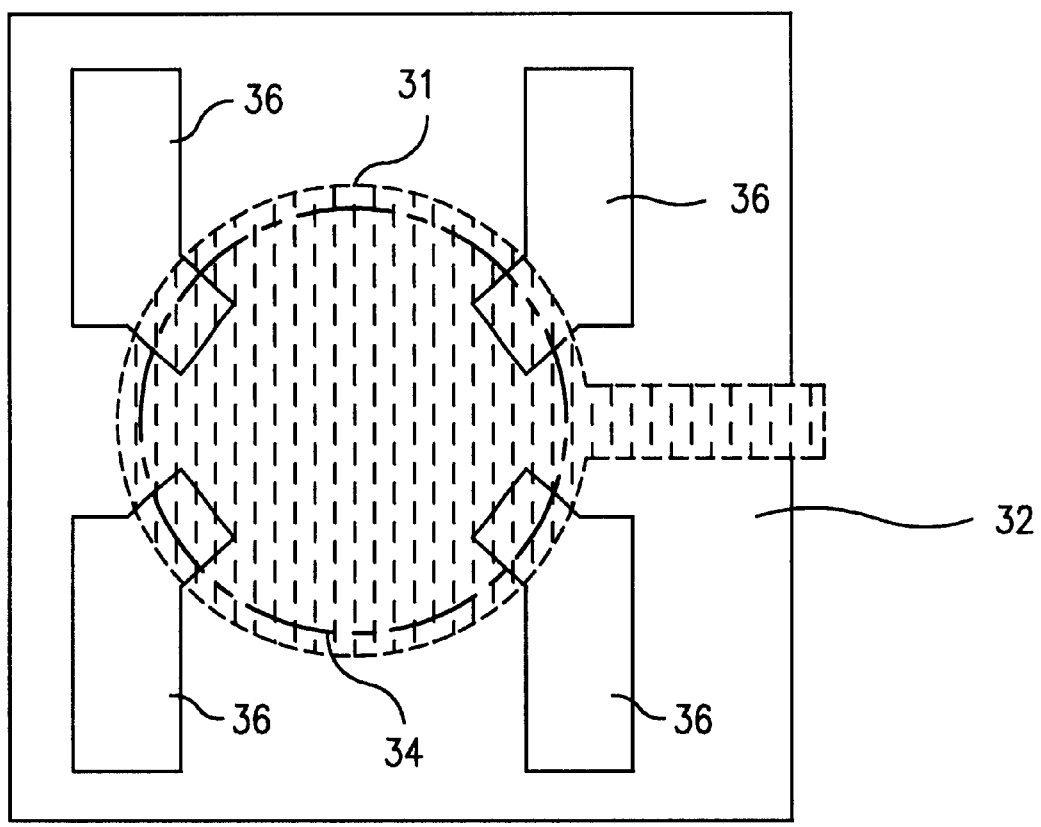
FIG. 3B is a plan view showing antifuses in accordance with a second preferred embodiment of the present invention.

As shown in FIG. 3B, the antifuses may also comprise a single first conductive layer 31 and four second conductive layers 36, with the IMD layer 32 in between the first conductive layer 31 and the second conductive layer 36.

Figure 4A:
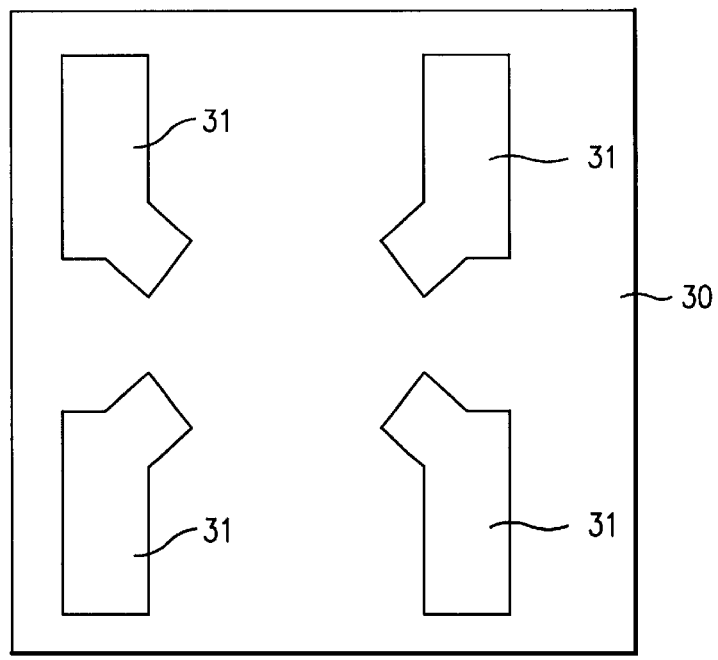
FIGS. 4A–4D are plan views showing preferred steps for manufacturing the antifuses of FIG. 3A.

FIGS. 4A–4D show a preferred method of fabricating the antifuses shown in FIG. 3A. As shown in FIG. 4A, a first metal layer and a first photosensitive layer are formed on a semiconductor substrate 30, and the first photosensitive layer is selectively exposed to light and developed so that it remains on regions where the first conductive layers 31 are to be formed. The metal layer is selectively etched, using the first photosensitive layer as a mask, thus forming the first conductive layers 31. The first photosensitive layer is then removed. The first conductive layers 31 are preferably made of aluminum or aluminum alloy.

Figure 4B:
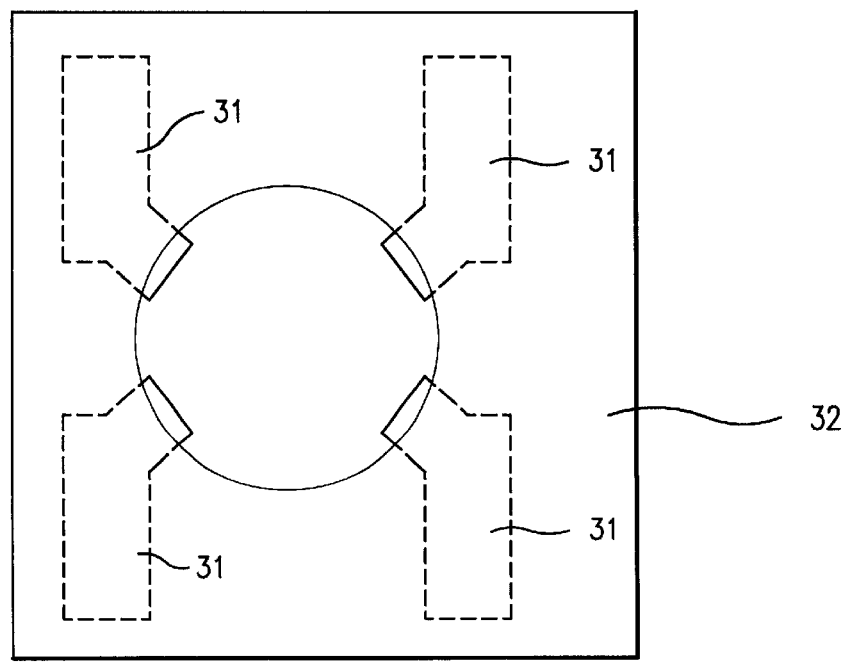

As shown in FIG. 4B, an IMD layer 32 and a second photosensitive layer are formed over the entire surface, including the first conductive layers 31. Tetra ethyl ortho silicate (TEOS) or boron phosphorus silicate glass (BPSG) is preferably used for the IMD layer 32. The second photosensitive layer is selectively exposed to light and developed so that it is removed over a region where the via hole, a path for electrical connection, will be formed. After that, the IMD layer 32 is selectively etched using the second photosensitive layer as a mask, thus forming the via hole. The second photosensitive layer is then removed.

Figure 4C:
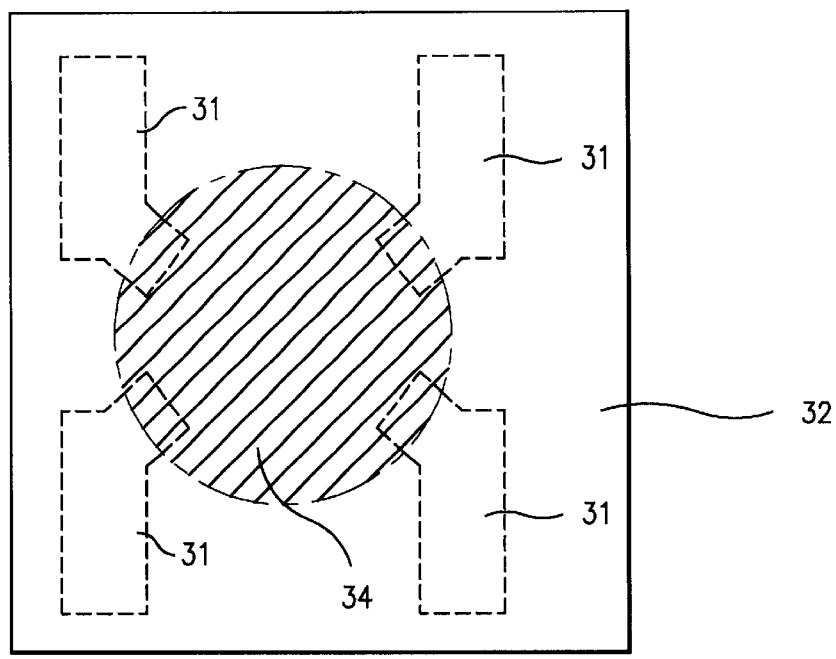

As shown in FIG. 4C, the edges of the IMD layer 32 around the via hole are etched, preferably by an Ar sputtering technique, to make the upper portion of the via hole rounded. An intrinsic semiconductor layer 34 and a third photosensitive layer are formed on the IMD layer 32, including the via hole. The intrinsic semiconductor layer is preferably made of amorphous silicon. The third photosensitive layer is selectively exposed to light and developed so that it remains over the via hole and over a predetermined portion of the IMD layer 32 around the via hole. The intrinsic semiconductor layer 34 is selectively etched using the third photosensitive layer as a mask, and the third photosensitive layer is then removed.

Figure 4D:
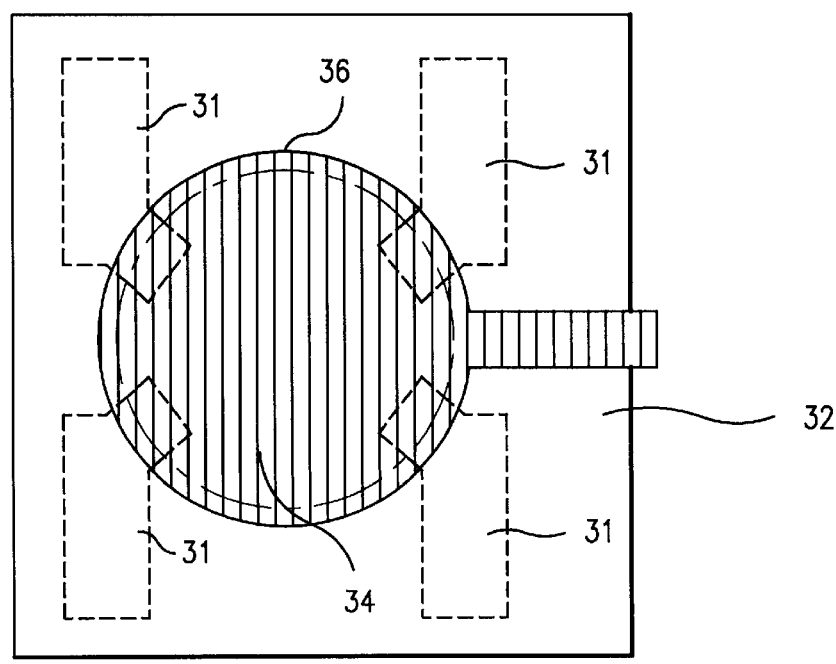

As shown in FIG. 4D, a second metal layer and a fourth photosensitive layer are formed on the IMD layer 32, including the intrinsic semiconductor layer 34 that was selectively etched. The fourth photosensitive layer is selectively exposed to light and developed so that it remains over the intrinsic semiconductor layer 34 and over a predetermined portion of the IMD layer 32. The second metal layer is selectively etched using the fourth photosensitive layer as a mask, thus forming second conductive layer 36. After that, the fourth photosensitive layer is removed. The intrinsic semiconductor layer 34 is formed to cover one end of each of the first conductive layers 31, thus making four antifuses in the via hole. Each of these antifuses has a rounded upper portion, and the second conductive layer 36 is preferably made of aluminum or aluminum alloy.

Figure 5:
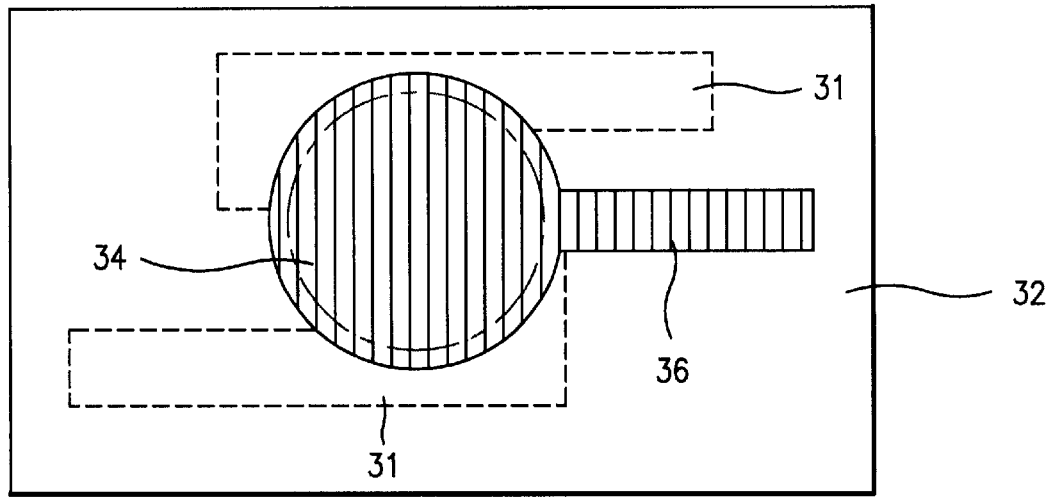
FIG. 5 is a plan view of antifuses in accordance with a third preferred embodiment of the present invention.
Figure 6:
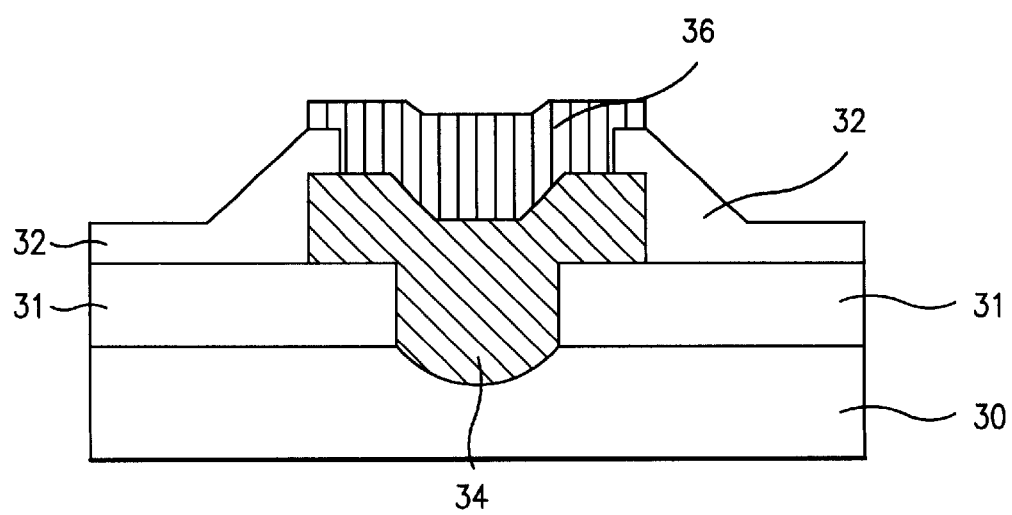
FIG. 6 is a sectional view of the antifuses of FIG. 5.

FIG. 5 is a plan view of antifuses in accordance with a third preferred embodiment of the present invention. FIG. 6 is a side-sectional view of the antifuses shown in FIG. 5.

FIGS. 7A–7D show steps for manufacturing the antifuses shown in FIGS. 5 and 6. FIGS. 8A–8D are plan views of the steps shown in FIGS. 7A–7D, respectively.

As shown in FIGS. 5 and 6, the antifuses of the third preferred embodiment include two first conductive layers 31 each formed on a predetermined portion of a semiconductor substrate 30, an intrinsic semiconductor layer 34 formed on and between the first conductive layers 31, an IMD layer 32 formed over the entire surface except for a predetermined portion of the intrinsic semiconductor layer 34, and a second conductive layer 36 formed on predetermined portions of the IMD layer 32 and the intrinsic semiconductor layer 34 between etched the IMD layers 32.

Figure 7A:
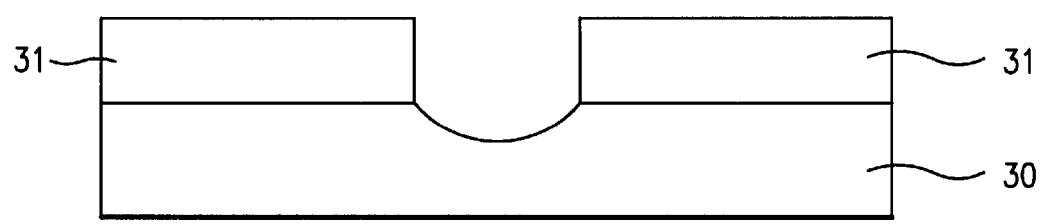
FIGS. 7A–7D are sectional views showing preferred steps for manufacturing the antifuses of FIGS. 5 and 6.
Figure 8A:
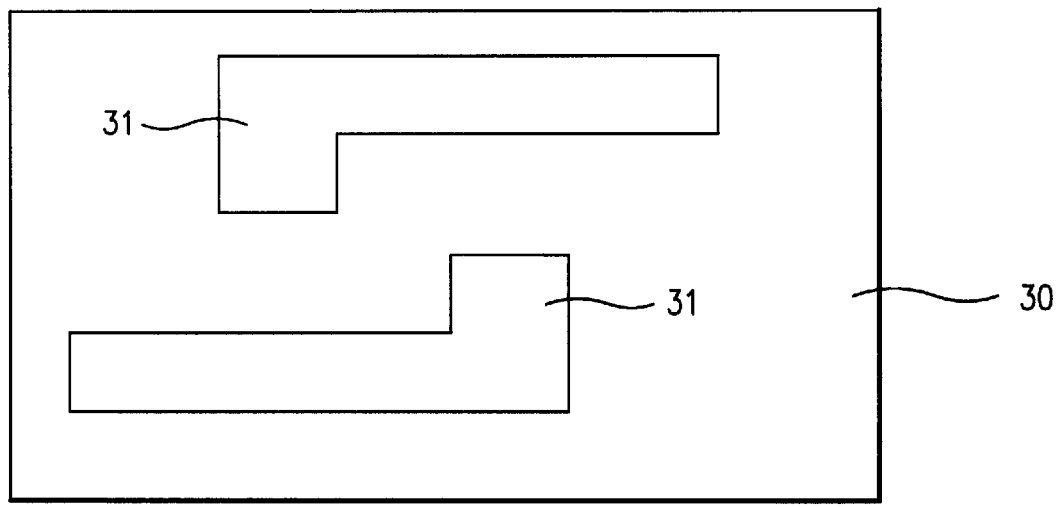
FIGS. 8A–8D are plan views of the manufacturing steps shown in FIGS. 7A–7D.

Referring to FIGS. 7A and 8A, a method of fabricating antifuses in accordance with the present invention will be described as follows.

A first metal layer and a first photosensitive layer are formed on a semiconductor substrate, and the first photosensitive layer is selectively exposed to light and developed so that it remains over regions where first conductive layers will be formed. The metal layer is selectively etched using the first photosensitive layer as a mask, to form two first conductive layers 31. Subsequently, the first photosensitive layer is removed. Each of the first conductive layers 31 is preferably made of aluminum or aluminum alloy.

Figure 7B:
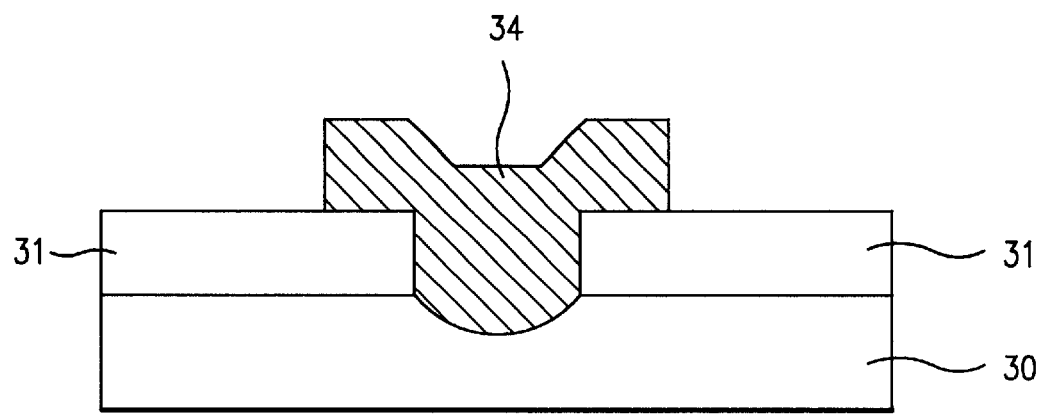
Figure 8B:
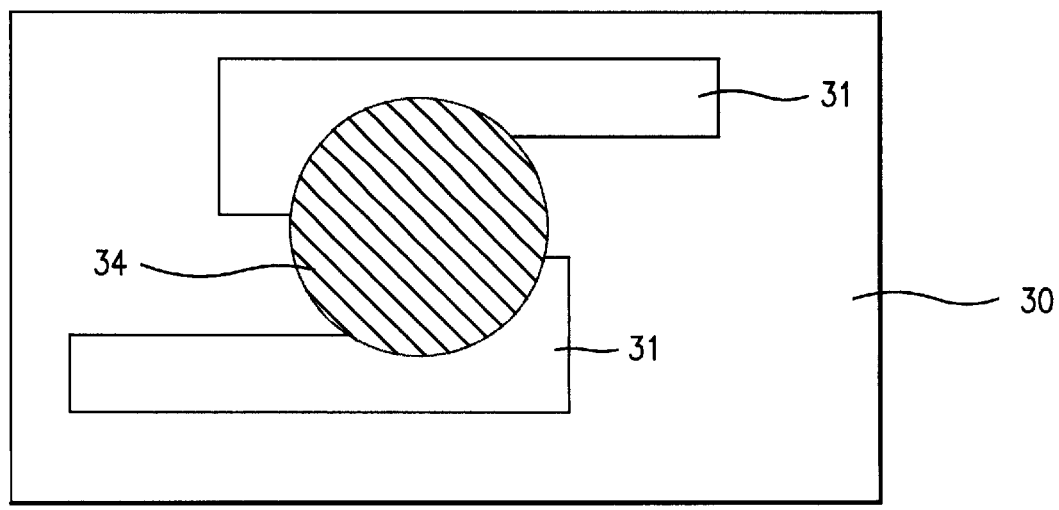

As shown in FIGS. 7B and 8B, an intrinsic semiconductor layer and a second photosensitive layer are formed over the entire surface, including the two first conductive layers 31. The intrinsic semiconductor layer is preferably made of amorphous silicon, and will hereinafter be referred to as amorphous silicon film 34. The second photosensitive layer is selectively exposed to light and developed so that it remains over predetermined portions between the first conductive layers 31. The amorphous silicon film 34 is selectively etched using the second photosensitive layer as a mask, and the second photosensitive layer is removed.

Figure 7C:
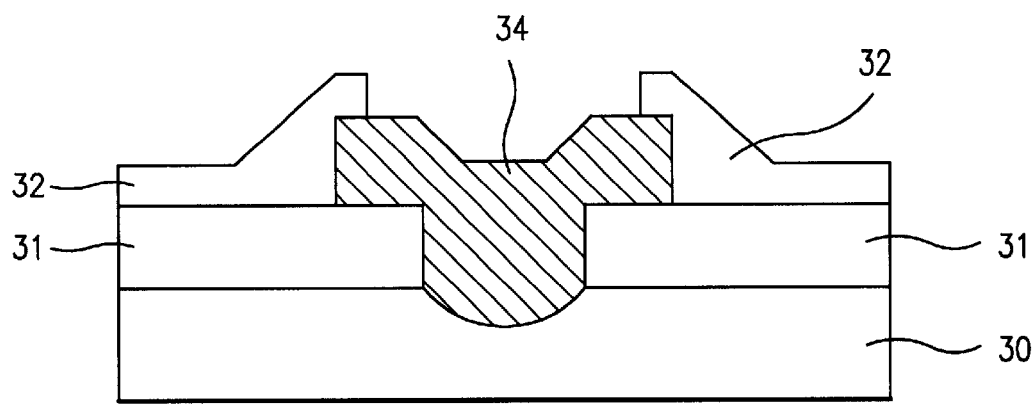
Figure 8C:
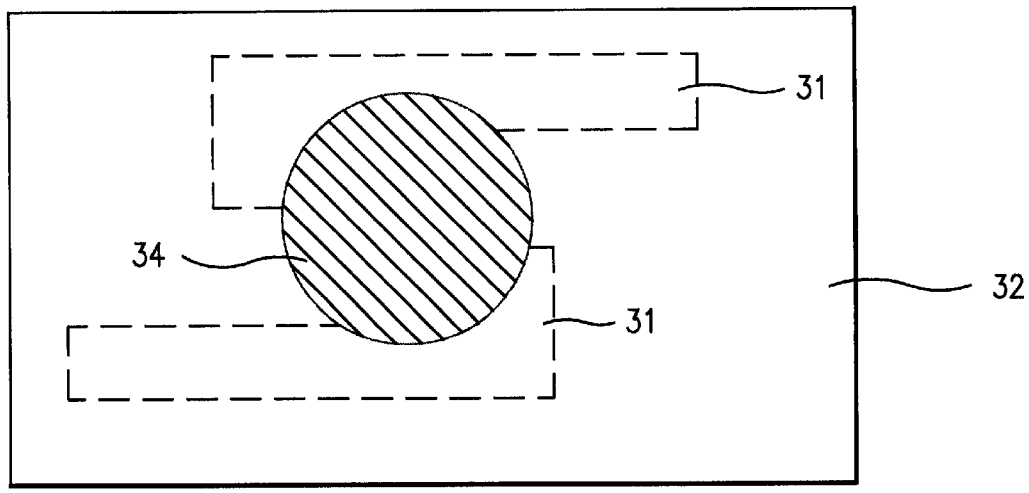

As shown in FIGS. 7C and 8C, an IMD layer 32 and a third photosensitive layer are formed over the entire surface, including the amorphous silicon film 34. TEOS or BPSG is preferably used for the IMD layer 32. The third photosensitive layer is selectively exposed to light and developed so that it is removed over a predetermined portion of the amorphous silicon film 34. The IMD layer 32 is selectively etched using the third photosensitive layer as a mask, and the third photosensitive layer is removed.

Figure 7D:
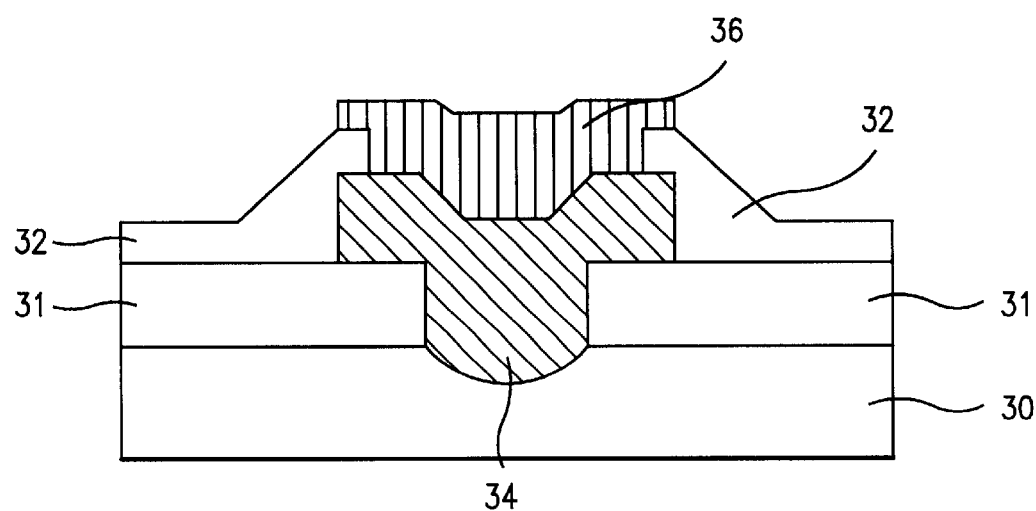
Figure 8D:
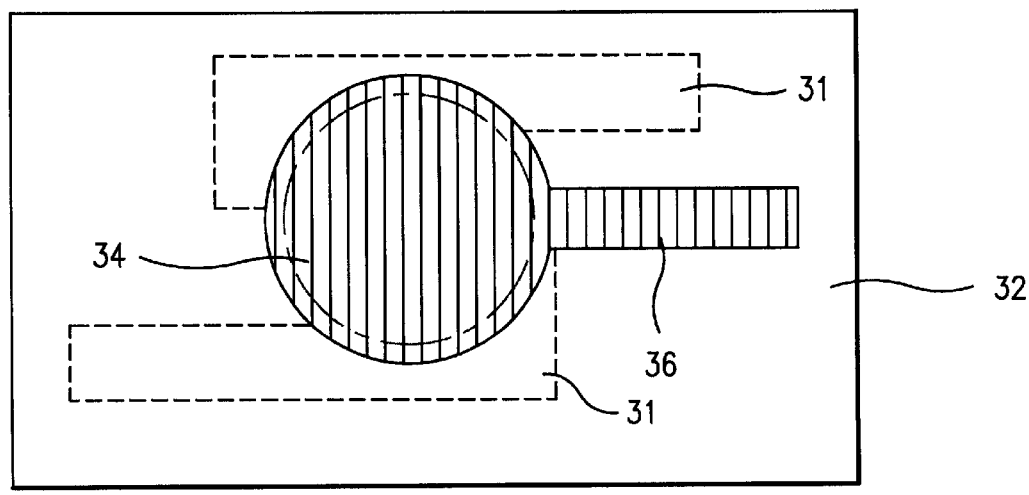

As shown in FIGS. 7D and 8D, a second metal layer and a fourth photosensitive layer are formed over the entire surface, including the IMD layer 32. The fourth photosensitive layer is selectively exposed to light and developed so that it remains over the area overlying the amorphous silicon film 34 and over a portion of the etched IMD layer 32. The second metal layer is selectively etched using the fourth photosensitive layer as a mask, thus forming a second conductive layer 36. The fourth photosensitive layer is then removed.

The amorphous silicon film 34 is formed so as to cover one end of each of the first conductive layers 31, thus making two antifuses in the via hole. Each of these antifuses has a rounded upper portion, and the second conductive layer 36 is preferably made of aluminum or aluminum alloy.

According to the inventive antifuses and the method of fabricating the same, a plurality of antifuses are formed in a single region by forming a via hole connected with a plurality of the first conductive layers or by forming an amorphous silicon film that contacts two first conductive layers. The respective antifuses can operate multiple times over a single region, thereby increasing the number of antifuses that can be obtained per unit area. Accordingly, the present invention enhances the efficiency of FPGA and reduces the chip size, thus lowering the production costs.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. Antifuses, comprising:

a plurality of first conductive layers;

an insulating layer formed on the plurality of first conductive layers, wherein the insulating layer overlaps at least a portion of each of the plurality of first conductive layers; and a second conductive layer formed on the insulating layer;

wherein the plurality of first conductive layers are formed on a substrate, and the plurality of first conductive layers define a recess in the substrate, and the insulating layer is formed in the recess, and the insulating layer is adapted to breakdown electrically when a predetermined voltage is applied across any one of the plurality of first conductive layers and the second conductive layer.

2. The antifuses of claim 1, wherein the plurality of first conductive layers comprise four conductive layers.

3. The antifuses of claim 1, wherein the plurality of first conductive layers comprise two conductive layers.

4. The antifuses of claim 1, wherein the insulating layer has a round upper surface shape.

5. The antifuses of claim 1, wherein the insulating layer is in contact with the plurality of first conductive layers at one of a recess and a via hole.

6. The antifuses of claim 1, wherein electrical breakdown of the insulating layer occurs at a corner of an end of each of the plurality of first conductive layers when the predetermined voltage is applied across the first and second conductive layers.

7. The antifuses of claim 1, wherein the insulating layer comprises an intrinsic semiconductor layer.

8. The antifuses of claim 7, wherein the intrinsic semiconductor layer comprises amorphous silicon.

* * * * *